(12) United States Patent
Nguyen

(10) Patent No.: US 6,429,686 B1
(45) Date of Patent: Aug. 6, 2002

(54) OUTPUT DRIVER CIRCUIT USING THIN AND THICK GATE OXIDES

(75) Inventor: Hy V. Nguyen, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/595,779

(22) Filed: Jun. 16, 2000

(51) Int. Cl.[7] .......................................... H03K 19/003
(52) U.S. Cl. ............................. 326/86; 326/58; 326/81
(58) Field of Search ............................. 326/55–58, 80, 326/81, 83, 86

(56) References Cited

U.S. PATENT DOCUMENTS

| | | | | |
|---|---|---|---|---|
| 5,418,476 A | * | 5/1995 | Strauss ........................ | 326/81 |
| 5,635,861 A | * | 6/1997 | Chan et al. ................... | 326/81 |
| 5,933,025 A | | 8/1999 | Nance et al. | |
| 6,130,557 A | * | 10/2000 | Drapkin et al. ............... | 326/81 |
| 6,175,952 B1 | * | 1/2001 | Patel et al. ................... | 326/80 |
| 6,184,716 B1 | * | 2/2001 | Depetro et al. ............... | 326/81 |

OTHER PUBLICATIONS

"The 1999 Programmable Logic Data Book", Xilinx, Inc., pp. 5–5 to 5–15.

* cited by examiner

*Primary Examiner*—Don Phu Le
(74) *Attorney, Agent, or Firm*—Jeanette S. Harms; Bever Hoffman & Harms

(57) ABSTRACT

An output driver on an integrated circuit (IC) includes at least one transistor that has a thicker gate oxide than other standard transistors in the IC. In one embodiment, the output driver includes two pull-up transistors. A first pull-up transistor has a thicker gate oxide than standard transistors on the IC to provide a wide range of output voltages on the pad. A second pull-up transistor has a standard, i.e. thin, gate oxide thickness to ensure a fast low-to-high voltage transition on the pad. The other transistors in the output driver have standard gate oxide thicknesses. Illustrative thicknesses include 150 Angstroms for the first pull-up transistor and 50 Angstroms for the second pull-up transistor.

19 Claims, 5 Drawing Sheets

OUTPUT DRIVER CIRCUIT USING THIN AND THICK GATE OXIDES

FIELD OF THE INVENTION

This invention relates generally to an input/output structure for an integrated circuit and, in particular, to an output driver using thin and thick gate oxides.

BACKGROUND OF THE INVENTION

As integrated circuit (IC) designs become more complex, IC developers are moving toward smaller geometries to provide these designs without sacrificing valuable board space. However, smaller geometries require lower power supply voltages due to transistor breakdown. Specifically, for a given power supply voltage, the electric field strength, i.e. the change in voltage per unit length, that a transistor is exposed to increases as the size of the transistor is reduced.

The maximum electric field tolerance can be a limiting factor on the minimum transistor size. For example, a typical maximum gate oxide field strength for silicon dioxide gates is about 3 megavolts per centimeter. High electric fields inside a transistor can reduce the mean time to failure, and can destroy transistors when an electric field exceeds the breakdown value for a given material in a transistor, such as the gate oxide in CMOS devices. Therefore, in 0.35 $\mu$m CMOS technology, a typical power supply of 3.3 Volts (a maximum power supply of 3.3 Volts+10%) is provided, whereas in 0.25 $\mu$m CMOS technology, a typical power supply of 2.5 Volts (a maximum power supply of 2.5 Volts+10%) is provided.

An IC typically has a plurality of input/output (I/O) circuits that act as an interface between the internal circuits of the IC and the environment external to the IC. FIG. 1 illustrates a typical I/O circuit 100 that includes an input driver 101 and an output driver 103. Output driver 103 drives an electrical signal generated by one or more internal circuits that provide a function f to a pad 104 that is connected to the external environment. Input driver receives a signal from the external environment through pad 104 and drives that signal to one or more internal circuits 102.

When two ICs having different power supply levels are coupled together, the I/O circuit is generally required to prevent damage to transistors in the device having the lower power supply level. For example, in one illustrative technology, the XC9500XL™ complex programmable logic device (CPLD), available from Xilinx, Inc., has 5 Volt tolerant I/O pins that accept 5 Volt, 3.3 Volt, and 2.5 Volt signals.

To further complicate IC design, some IC structures are exposed to different voltages on chip. For example, the XC9500XL CPLD includes an on-chip charge pump that generates high voltages of, in one embodiment, +8 Volts or −8 Volts. Transistors that transfer such high voltages require correspondingly thick gate oxides to prevent transistor breakdown. However, the flash memory cells of the XC9500XL CPLD are programmed/erased by these high voltages. Therefore, these memory cells require an intermediate gate oxide thickness. Finally, standard logic in the XC9500XL CPLD is not exposed to the high voltages of the charge pump and thus transistors that comprise the standard logic require only a thin gate oxide.

The thicknesses vary depending on the technology. For example, in the XC9500XL CPLD implemented in 0.35 $\mu$m technology, devices have gate oxide thicknesses of 150 Angstroms, 100 Angstroms and 70 Angstroms. The 150 Angstrom thickness is used for transistors transferring the large voltages generated by the charge pump. The 100 Angstrom thickness is used for the tunneling oxide of the memory cells, i.e., between the floating gate and the substrate. (Note that the thickness of the oxide between the control gate of such a memory cell and the floating gate is typically 150 Angstroms). Finally, the 70 Angstrom thickness is used for the transistors comprising the standard logic, including the I/O circuitry.

Because of its interface to external circuits, the I/O circuitry is of particular concern to IC designers. Specifically, output drivers should provide a fast I/O delay when driving a predetermined capacitive load while protecting all transistors in the output driver from high voltages on the I/O pad. FIG. 2 illustrates a prior art, output driver 200 in a XC9500XL CPLD. Output driver 200 includes a pull-up transistor 205 coupled between an I/O voltage supply Vddio and an I/O pad 211. Output driver 200 further includes a pull-down transistor 209 and an isolation transistor 210 coupled in series between a ground voltage and pad 211. Isolation transistor 210 has its gate coupled to an internal supply voltage Vddint and therefore is conducting. In one embodiment, voltage Vddint is 3.3V.

In an enable (output) mode, either pull-up transistor 205 or pull-down transistor 209 is on, thereby providing the appropriate output data DOUT signal to pad 211. In contrast, in a tristate mode, both transistors 205 and 209 are off, thereby allowing pad 211 to provide an input signal to an input driver (not shown) and thereafter to the internal circuits (also not shown) of the PLD.

Input drivers are well known in the art and therefore are not described in detail herein. The internal circuits of the XC9500XL device are described in detail on pages 5-5 to 5-15 of "The 1999 Programmable Logic Data Book", published by Xilinx, Inc. and incorporated by reference herein.

Output driver 200 receives an output enable signal OE that determines whether output driver 200 is tristated or active. In the tristate mode, when the output enable signal OE is low, then an inverter 201 provides a high signal to an input terminal of a NOR gate 202, thereby ensuring that NOR gate 202 outputs a low signal. An inverter 203 inverts this low signal. A protection transistor 204 has the I/O voltage Vddio applied to its gate. Voltage Vddio turns on protection transistor 204, thereby transferring the high signal output from inverter 203 (less one threshold voltage of its associated NMOS transistor) to the gate of pull-up transistor 205 and turning off that transistor. Note that the power supply provided to the logic of output driver 200, unless otherwise noted, is voltage Vddint.

Also in the tristate mode, the low OE signal is provided to an input terminal of NAND gate 207, thereby ensuring that NAND gate 207 outputs a high signal. An inverter 208 inverts that high signal and therefore provides a low signal to the gate of pull-down transistor 209. In this manner, transistor 209 is also turned off.

In the active mode, a high OE signal results in a low signal provided to NOR gate 202 and a high signal provided to NAND gate 207. Therefore, the output signals of those gates depend on the state of the data output DOUT signal. If DOUT is high, then both NOR gate 202 and NAND gate 207 output a low signal. In this manner, transistor 205 is turned off, but transistor 209 is turned on, thereby providing a low signal on pad 211. Thus, driver 200 provides an inverted DOUT signal on pad 211 during the active mode.

On the other hand, if DOUT is low, then both NOR gate 202 and NAND gate 207 outputs a high signal. In this manner, transistor 209 is turned off, but transistor 205 is turned on, thereby providing a high signal on pad 211.

Pull-down transistor 209 must be protected when pad 211 is used as an input pin and carries a voltage up to 5.5V. Isolation transistor 210 has its gate connected to Vddint (3.3 Volts) and thus the voltage at the drain of pull-down transistor 209 is no more than Vddint minus an NMOS threshold drop (i.e., 3.6−0.7=2.9). Therefore, transistor 209, which can withstand a junction (gate to source or gate to drain) voltage of 3.6 Volts, will not experience damaging voltage levels.

Pull-up transistor 205 must be prevented from conducting current to Vddio (3.3 Volts or 2.5 Volts) when pad 211 is used as an input pin and carries a voltage up to 5.5V. Thus, output driver 200 includes a well driver 206 that maintains a sufficiently high voltage to the well and the gate of pull-up transistor 205 to prevent leakage current through this transistor. One known well driver is described in U.S. Pat. 5,933,025, entitled "Low Voltage Interface Circuit With A High Voltage Tolerance", which is incorporated by reference herein. Other, conventional well drivers are well known to those skilled in the art and therefore are not described in detail herein.

As noted previously, the transistors in the I/O circuitry, including driver 200, are comprised of transistors having an oxide thickness of 70 Angstroms. The channel widths and lengths for the PMOS and NMOS transistors of output driver 200 are as follows: Wp=228 μm, Lp=0.35 μm, Wn=220 μm, and Ln=0.35 μm (wherein "p" designates a PMOS transistor, and "n" designates an NMOS transistor).

Output driver 200, implemented with transistors having a gate oxide thickness of 70 Angstroms, has two advantages. First, output driver 200 can protect its transistors from standard high voltages on pad 211 including both 3.3 Volts and 5 Volts. Second, the I/O delay (i.e., the time from the input terminal of inverter 201 to pad 211) is acceptable at 2.30 nanoseconds for driving a capacitive load 212. In a typical embodiment, capacitive load 212 is approximately 35 picofarad.

If the XC9500XL CPLD is implemented in 0.25 μm technology, transistors in this device have gate oxide thicknesses of 150 Angstroms, 100 Angstroms and 50 Angstroms. As described previously, the gate oxide thickness of 150 Angstroms is used for transistors transferring the large voltages generated by the on-chip charge pump. The gate oxide thickness of 100 Angstroms is used for the memory cells on the chip. Finally, the gate oxide thickness of 50 Angstroms is used for the transistors comprising the remainder of the logic, including the I/O circuitry. The channel widths and lengths for the PMOS and NMOS transistors of output driver 200 (as well as any standard transistors) are as follows: Wp=228 μm, Lp=0.25 μm, Wn=220 μm, and Ln=0.25 μm Note that in 0.25 micron technology, internal voltage Vddint is 2.5 Volts.

Output driver 200, implemented with transistors having a gate oxide thickness of 50 Angstroms, has both advantages and disadvantages. Specifically, because of the thinner oxide (and thus lower threshold voltage and more rapidly achieved saturation current), these transistors can turn on/off faster than thicker oxide transistors. Thus, in this implementation, output driver 200 has a faster I/O delay of only 1.60 nanoseconds driving the same capacitive load 212.

However, as explained below, output driver 200 can no longer provide an I/O voltage Vddio of 3.3 Volts to pad 211, thereby limiting the type of external devices coupled to device 100. Specifically, because the oxide thickness is only 50 Angstroms, a conducting transistor can have a maximum voltage of 2.75V (2.5V+10%) across any junction (i.e., gate to source or gate to drain). If the gate of transistor 205 were grounded, thereby turning on pull-up transistor 205, then a maximum voltage Vddio of 3.6 Volts on its source would exceed the maximum permissible junction voltage. Therefore, output voltage Vddio in this embodiment of output driver 200 is limited to either 2.5 Volts or 1.8 Volts.

Moreover, output driver 200 has an I/O tolerance limited to 3.3 Volts. Specifically, as described above, a conducting transistor having a gate oxide thickness of 50 Angstroms can have a maximum voltage of 2.75 Volts (2.5 Volts+10%) across any junction (i.e., gate to source or gate to drain). If the gate of isolation transistor 210 receives a Vddio of 2.25 Volts (2.5 Volts−10%)), thereby turning on isolation transistor 210, then a voltage on pad 211 of 5.5 Volts would exceed the maximum permissible junction voltage (5.5−2.25=3.25). Therefore, the I/O tolerance in this embodiment of output driver 200 is limited to a voltage of 3.3 Volts (3.6−2.25=1.45) or less.

Due to current fabrication techniques, fabrication houses have established an industry standard limited to three gate oxide thicknesses. Thus, although providing pull-up transistor 205 with a gate oxide thickness of 70 Angstroms would solve the junction voltage problem by increasing the permissible junction voltage to 3.6 Volts, an IC implemented in 0.25 micron technology is currently limited to transistors having gate oxide thicknesses of 150, 100, or 50 Angstroms.

Therefore, a need arises for an output driver providing maximum choices of output voltages while operating within industry fabrication standards.

SUMMARY OF THE INVENTION

An output driver of the present invention includes a first pull-up transistor coupled to a pad of an integrated circuit. The first pull-up transistor has a thick gate oxide, thereby ensuring that the output driver can provide a full range of industry standard output (Vddio) voltages. In one embodiment, these voltages include 3.3 Volts, 2.5 Volts, and 1.8 Volts.

In one embodiment, the output driver further includes a second pull-up transistor coupled to the pad. The second pull-up transistor-has a thin gate oxide, thereby ensuring a fast low-to-high voltage transition on the pad. In this embodiment, the gate oxide thicknesses of the first and second pull-up transistors are 150 Angstroms and 50 Angstroms, respectively.

In accordance with this embodiment of the present invention, the first and second pull-up transistors are sized to minimize use of silicon resources, while at the same time provide satisfactory drive current and switching time (i.e., low-to-high transitions). For example, the output driver of the invention typically requires approximately 20% less area than standard output drivers.

In one embodiment, the sources of the first and second pull-up transistors are coupled to different voltages. For example, the source of the first pull-up transistor may be coupled to any industry standard output voltage, as mentioned above, whereas the source of the second pull-up transistor is only coupled to the internal voltage supply of the IC (such as 2.5 Volts). The output driver also includes a pull-down transistor having a source coupled to a second predetermined voltage (such as ground) and a drain coupled to the pad.

The pull-down transistor and the two pull-up transistors are selectively disabled by a logic circuit. Specifically, the gates of these transistors are coupled to the logic circuit that provides an output enable signal. In one state, a tristate mode, the pull-down transistor and the two pull-up transistors are turned off, thereby allowing an input signal to be placed on the pad. In the other state, the enable mode, the data out signal determines whether the pull-down transistor is turned on (and the pull-up transistors are turned off), or the pull-up transistors are turned on (and the pull-down transistor is turned off).

In one embodiment, the output driver includes a protection transistor having a gate coupled to the output voltage supply, a drain coupled to a gate of the first pull-up transistor, and a source coupled to receive an output signal of the logic circuit (the output enable signal as well as the data out signals). To protect the pull-down transistor and the second pull-up transistor from high voltages on the pad, an isolation transistor may also be provided. This isolation transistor has a gate coupled to the internal voltage supply, a drain coupled to the pad, and a source coupled to the pull-down and the second pull-up transistors.

In one embodiment, the output driver includes a logic shifter for receiving the output signal of the logic circuit and providing an output signal to the gate of the first pull-up transistor. If the level shifter inverter receives a high internal signal, such as 2.5 Volts, then the inverter outputs a low output signal (typically 0 Volts). However, if the level shifter inverter receives a low internal signal (0 Volts), then the inverter outputs a high output signal at a different level than the high internal signal (such as 3.3 Volts). In this manner, the output driver ensures that the first pull-up transistor is turned off during the tristate mode as well as during the active mode when the data out signal is high (wherein the output driver provides an inverted data out signal). In one embodiment, the output driver is used in combination with an input driver to form an input/output (I/O) structure on the IC. The input driver provides an input signal on the I/O pad to the internal circuitry of the IC.

BRIEF DESCRIPTION OF THE DRAWINGS

The advantages, features, and embodiments of the invention will become apparent from the following detailed description of the invention and the accompanying drawings.

DETAILED DESCRIPTION OF THE DRAWINGS

Figure 3A:
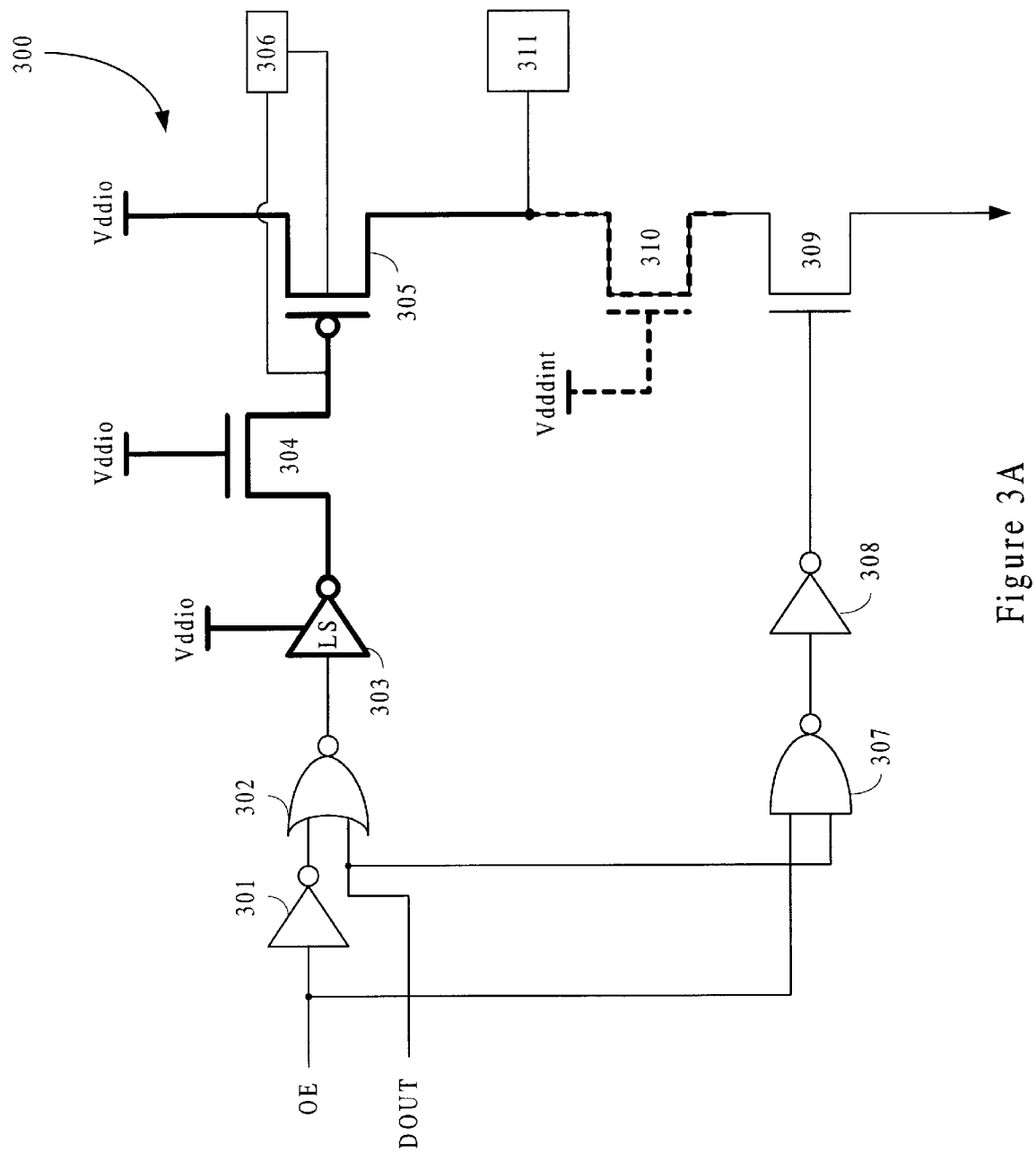
FIG. 3A is a circuit diagram of one embodiment of an output driver of the present invention.

In accordance with the present invention, the output driver includes transistors having both thick and thin gate oxides. In this manner, the present invention can provide the full range of standard output voltages while ensuring a fast I/O delay. FIG. 3A illustrates one embodiment of an output driver 300 in accordance with the present invention implemented in 0.25 technology. Output driver 300 receives a Vddint of 2.5 Volts and a Vddio of 3.3 Volts, 2.5 Volts, or 1.8 Volts. (Note that although different voltages Vddio may be provided on one chip, only one voltage Vddint is typically provided on one chip.) In this embodiment, pull-up transistor 305 and protection transistor 304 have a gate oxide thickness of 150 Angstroms to prevent junction breakdown if voltage Vddio is 3.3 Volts. (As known by those skilled in the art, the intermediate gate oxide thickness is used solely for the memory cells of the chip. Therefore, to provide a voltage Vddio of 3.3 Volts requires use of the 150 Angstrom gate oxide.)

Moreover, in an embodiment to ensure an I/O tolerance of 5.5 Volts, isolation transistor 310 also has a gate oxide thickness of 150 Angstroms. However, if a maximum I/O tolerance of only 3.3 Volts is required, then the gate oxide thickness of isolation transistor 310 can be reduced to 50 Angstroms. For this reason, isolation transistor 310 is shown with bold, dashed lines.

Figure 3B:
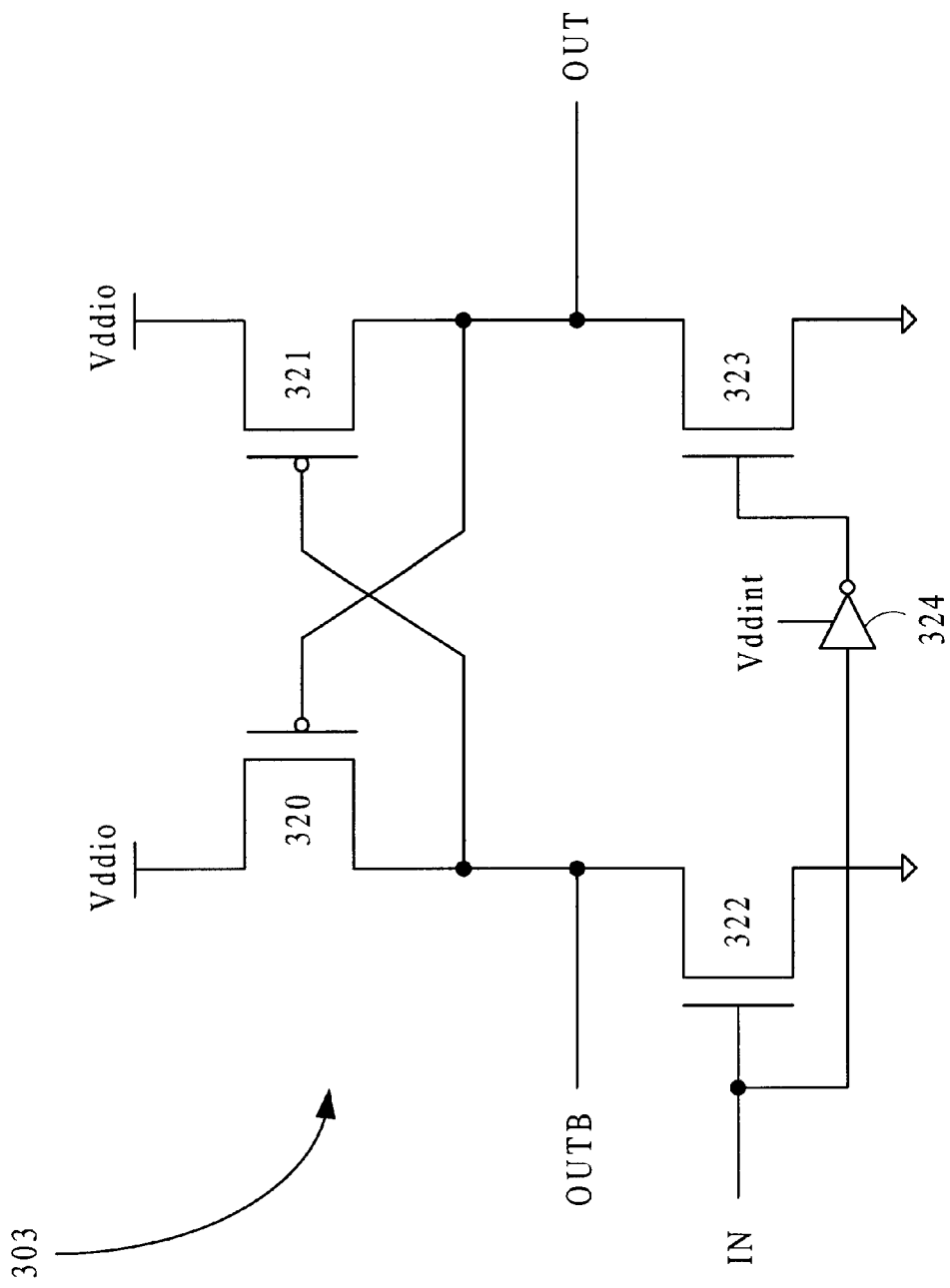
FIG. 3B is a circuit diagram of one high voltage, level shifter that can be used in the invention.

Output driver 300 further includes a level shifter (LVSH) 303, which replaces standard inverter 203. FIG. 3B illustrates one example of LVSH 303 receiving an input signal IN and generating two output signals OUT and OUTB. The purpose of LVSH 303 is to shift the level of the high signal. Specifically, LVSH 303 functions as follows. If LVSH 303 receives a low input signal IN, then transistors 323 and 320 turn on, thereby generating a low (ground) signal as output signal OUT and a high (Vddio) signal as output signal OUTB. If LVSH 303 receives a high input signal IN (i.e., Vddint), then transistors 322 and 321 turn on, thereby generating a high (Vddio) signal as output signal OUT and a low (ground) signal as output signal OUTB. Thus, LVSH 303 shifts the level of a high input sinal Vddint to Vddio. In this manner, pull-up transistor 305, having voltage Vddio on its source, will be guaranteed not to turn on during the enable mode if DOUT is low.

In output driver 300 (FIG. 3A), LVSH 303 provides output signal OUTB to the gate of pull-up transistor 305. In one embodiment, output signal OUT may be provided to the internal circuitry (not shown) of the chip via the programmable interconnect or may be provided to another output driver.

In a preferred embodiment of LVSH 303, transistors 320–323 have a gate oxide thickness of 150 Angstroms, thereby ensuring that a voltage Vddio of up to 3.3 Volts can be used without junction breakdown. In contrast, inverter 324, which only receives voltage Vddint, can be comprised of transistors having a gate oxide thickness of 50 Angstroms.

The other circuitry of output driver 300 (i.e., all devices other than LVSH 303) function similarly to corresponding circuitry in output driver 200 and therefore is not discussed in detail herein. Note that the remaining transistors in output driver 300, i.e., pull-down transistor 309 as well as the transistors comprising inverters 301/308, NOR gate 302, NAND gate 307, and well driver 306, have a gate oxide thickness of 50 Angstroms.

Although output driver 300 can provide the full range of output voltages, i.e. 3.3 Volts, 2.5 Volts, and 1.8 Volts, this output driver may be too large for some applications. Specifically, the size of the transistors having a gate oxide thickness of 150 Angstroms are: Wp=304 $\mu$m, Lp=0.7 $\mu$m, Wn=80 $\mu$m, and Ln=0.7 $\mu$m, wherein "p" designates a PMOS transistor and "n" designates an NMOS transistor. (Note that a transistor length of 0.9 $\mu$m is typically used for high voltage devices. In this case, the length of 0.7 $\mu$m is provided to ensure maximum speed. However, a length less than 0.7 $\mu$m may result in a leaky device.) In other embodiments, the dimensions of the transistors of output device 300 are within a range of approximately +/−10%.

Additionally, a chip including output driver 300 may be more appropriate for applications having few critical time requirements. Specifically, the I/O delay, particularly the low-to-high voltage transition, at output pad 311 is slower than output driver 200. In one embodiment, output driver 300 has an I/O delay of 3.30 nanoseconds. This delay is principally caused by the gate oxide thickness of pull-up transistor 305. As known by those skilled in the art, a thicker gate oxide increases the threshold voltage, thereby decreasing the corresponding current through the conducting transistor.

Figure 4:
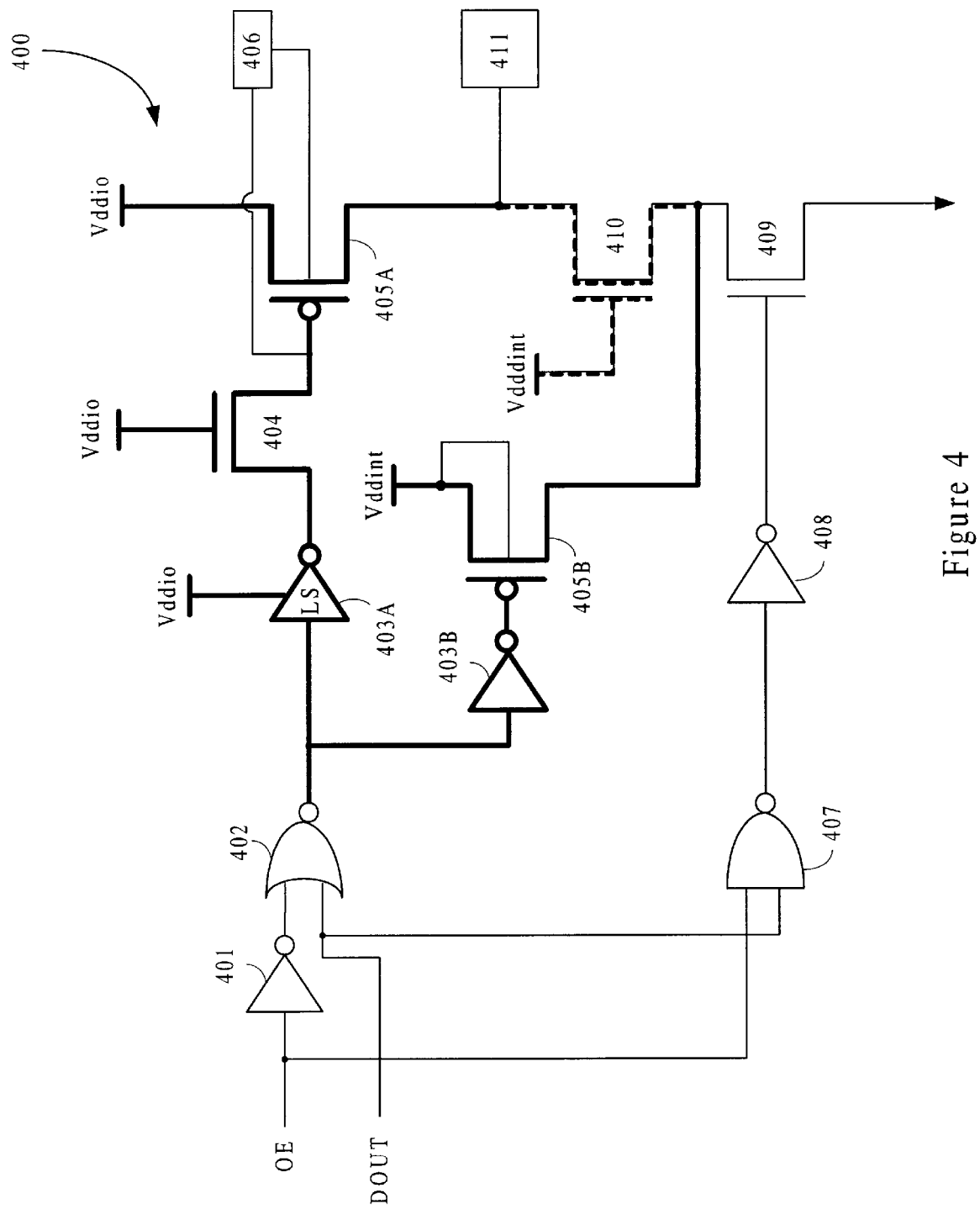
FIG. 4 is a circuit diagram of another embodiment of an output driver of the present invention.

Therefore, in accordance with another embodiment of the present invention shown in FIG. 4, an output driver 400 includes two pull-up transistors 405A and 405B. Pull-up transistor 405B has a gate oxide thickness of 50 Angstroms for increasing the speed of the low-to-high voltage transitions on pad 411, whereas pull-up transistor 405A has a gate oxide thickness of 150 Angstroms to maintain an appropriate DC current drive and to provide a full range of output voltages to pad 411. Output driver 400 further includes two inverters: a standard inverter 403B and a level shifter 403A.

The channel widths and lengths of transistors 405A, 405B, 404, as well as other PMOS and NMOS transistors in output driver 400 are listed below in Table 1.

TABLE 1

| Transistor(s) | Width (microns) | Length (microns) |
| --- | --- | --- |
| 405A (150 Å) | 80 | 0.7 |
| 405B (50 Å) | 160 | 0.25 |
| 404 (150 Å) | 40 | 0.25 |
| 410 (50/150 Å) | 120/240 | 0.25/0.54 |
| 409 (50 Å) | 120 | 0.25 |
| Other 50 Å NMOS | 120 | 0.25 |
| Other 50 Å PMOS | 160 | 0.25 |

Figure 1:
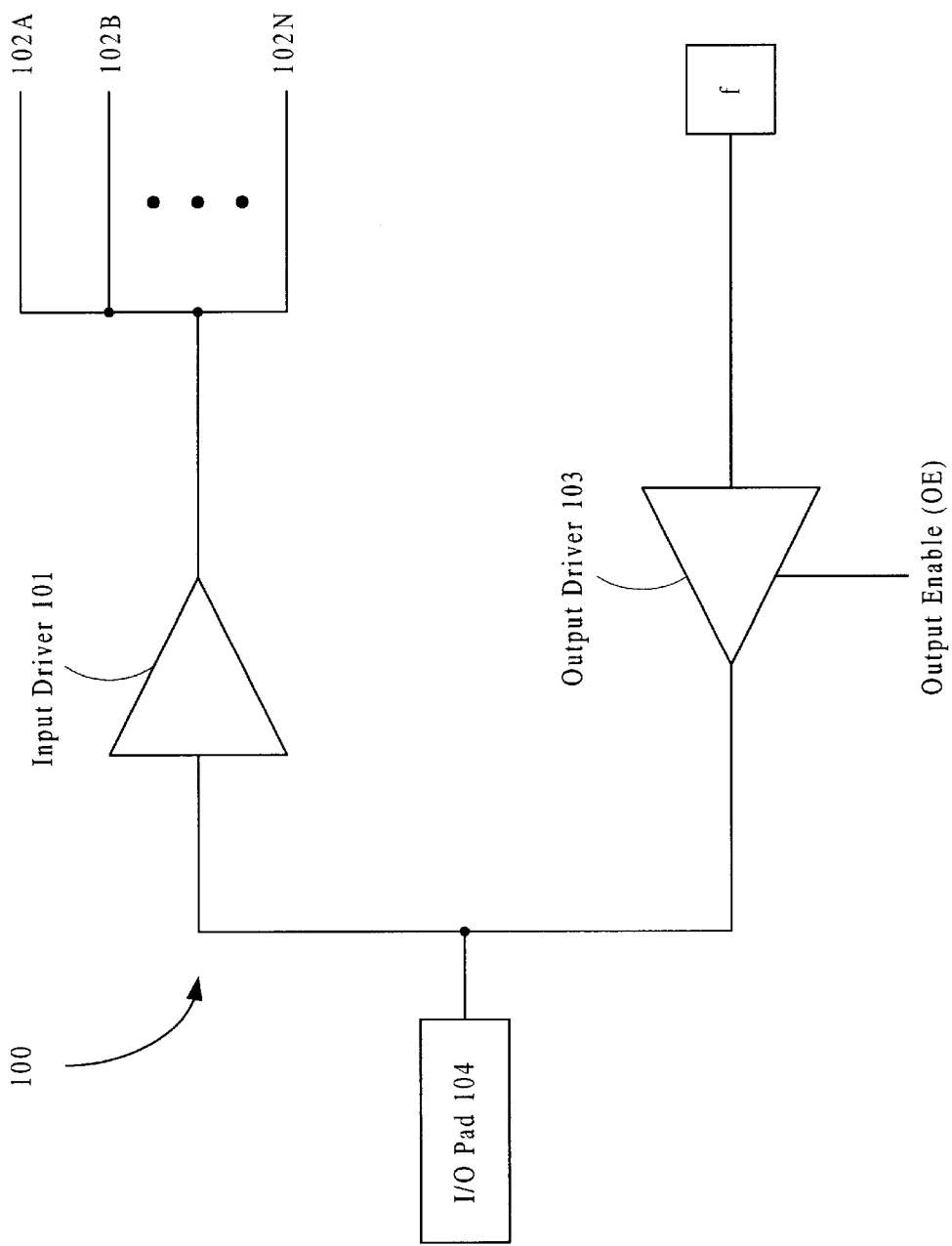
FIG. 1 illustrates a basic structure for an input/output (I/O) circuit in an integrated circuit.
Figure 2:
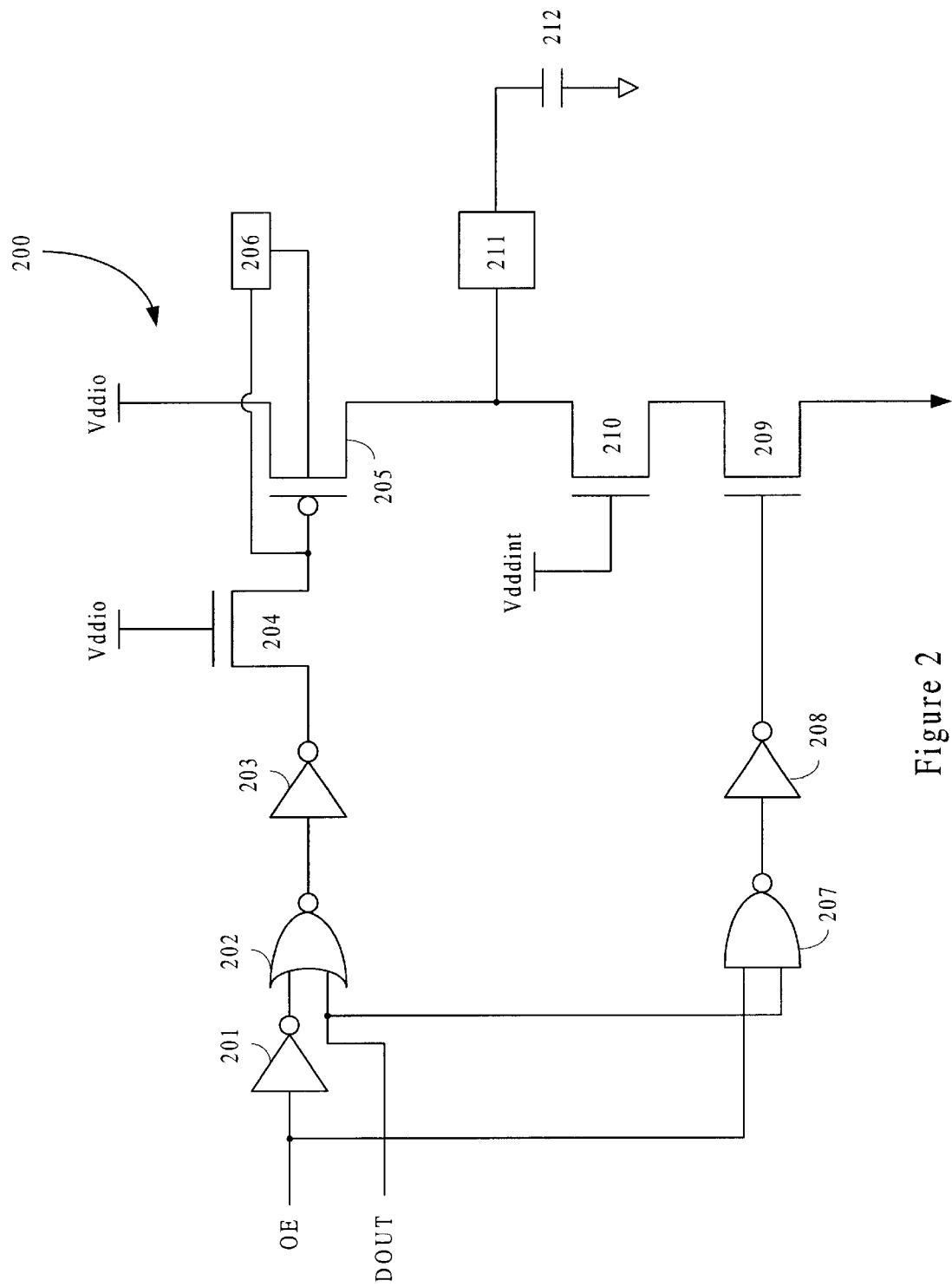
FIG. 2 illustrates a circuit diagram of a prior art output driver.

In the present invention, pull-up transistor 405A is sized merely to maintain DC current. Therefore, pull-up transistor 405A is relatively small compared to other PMOS transistors in output driver 400. Isolation transistor 410 may have one of two widths depending on the desired I/O tolerance of output driver 400 (explained in detail below). As known by those skilled in the art, PMOS devices are significantly larger in width than NMOS devices because the PMOS devices have less drive current. Although specific widths and lengths are provided in Table 1, each dimension is typically part of a range of acceptable widths or lengths. In one embodiment, the range is approximately +/-10% of the specified dimension. Known simulation programs, such as HSPICE, can be used to optimize the dimensions. Note that notwithstanding the additional logic in ouput driver 400 compared to output driver 200, the thicker gate oxide actually permits an overall layout area reduction. In fact, compared to the prior art driver of FIG. 2, output driver 400 reduces layout area by at least 20% (assuming the dimensions provided in Table 1).

Output driver 400 functions as follows. In an enable (output) mode, either pull-up transistors 405A/405B or pull-down transistor 409 is on, thereby providing the appropriate output data DOUT signal to pad 411. In contrast, in a tristate mode, both transistors 405A/405B and 409 are off, thereby allowing pad 411 to provide an input signal to an input driver (not shown) and thereafter to the internal circuits (also not shown) of the PLD.

Output driver 400 receives an output enable signal OE that determines whether output driver 400 is tristated or enabled. If output enable signal OE is low (tristate mode), then an inverter 401 provides a high signal to an input terminal of a NOR gate 402, thereby ensuring that NOR gate 402 outputs a low signal. Level shifter 403A and inverter 403B invert this low signal. Note that level shifter 403A is the same structure as level shifter 303 and therefore is not explained in detail herein. A protection transistor 404 has the I/O voltage Vddio applied to its gate. Voltage Vddio turns on protection transistor 404, thereby transferring the high signal output from level shifter 403A (Vddio) to the gate of pull-up transistor 405A. Of importance, because the source of pull-up transistor 405A is also at Vddio, this transistor is guaranteed to be turned off. The high signal output from inverter 403B (Vddint) is applied to the gate of pull-up transistor 405B, thereby also turning off transistor 405B.

In the tristate mode, the low OE signal is also provided to an input terminal of NAND gate 407, thereby ensuring that NAND gate 407 outputs a high signal. An inverter 408 inverts that high signal and therefore provides a low signal to the gate of pull-down transistor 409. In this manner, transistor 409 is also turned off. Thus, when output enable signal OE is low, output driver 400 is in a tristate mode.

In the enable mode, a high OE signal results in a low signal provided to NOR gate 402 and a high signal provided to NAND gate 407. Therefore, the output signals of those gates depend on the state of the data output DOUT signal. If DOUT is high, then both NOR gate 402 and NAND gate 407 output a low signal. In this manner, pull-up transistors 405A/405B are turned off, but pull-down transistor 409 is turned on, thereby providing a low signal on pad 411. Thus, output driver 400 provides an inverted DOUT signal on pad 411 during the enable mode.

On the other hand, if DOUT is low, then both NOR gate 402 and NAND gate 407 outputs a high signal. In this manner, pull-down transistor 409 is turned off, but pull-up transistors 405A/405B are turned on, thereby providing a high signal on pad 411. Because pull-up transistor 405B has a gate oxide thickness of 50 Angstroms, it will turn on faster than pull-up transistor 401 having a gate oxide thickness of 150 Angstroms. Moreover, the signal propagation time through isolation transistor 410 is as fast or faster than through protection transistor 404 (refer to device dimensions in Table 1). Therefore, pull-up transistor 405B ensures a significantly faster low-to-high voltage transition on pad 411 than if only pull-up transistor 405A were provided. Specifically, the I/O delay for output driver 400 of the present invention is only 1.70 nanoseconds compared to 3.3 nanoseconds for output driver 300.

Note that in this embodiment, Vddint is 2.5 Volts whereas Vddio is 3.3 Volts, 2.5 Volts, or 1.8 Volts. Thus, unless Vddio is 3.3 Volts, the voltage on pin 411 is pulled up to 2.5 Volts. If Vddio is 3.3 Volts, then the voltage on pin 411 is pulled up to 3.3 Volts.

As described previously, isolation transistor 410 has its gate connected to Vddint (2.5 Volts) and thus the voltage at the drain of pull-down transistor 409 is no more than Vddint minus an NMOS threshold drop (i.e., 2.75−0.7=2.05). Therefore, transistor 409 will not experience damaging voltage levels when pad 411 is used as an input pin and carries a voltage up to 5 Volts.

However, isolation transistor 410 must also be protected from high voltages on pad 411. Therefore, if isolation transistor 410 has a gate oxide thickness of 50 Angstroms, then the I/O tolerance of output driver 400 is limited to 3.3 Volts or lower. Specifically, the maximum junction voltage of isolation transistor 410 having this gate oxide thickness is 2.75 Volts. Therefore, a voltage on pad 411 of 3.6 Volts (3.3 Volts+10%) results in an acceptable, maximum junction voltage of 1.45 Volts (3.6 Volts−2.25 V (2.5 Volts−10%)= 1.45 Volts), whereas a voltage on pad 411 of 5.5 Volts (5.0 Volts+10%) results in an unacceptable, maximum junction voltage of 3.25 Volts (5.5 Volts−2.25 (2.5 Volts−10%)=3.25 Volts).

Therefore, in one embodiment that increases the I/O tolerance of output driver 400 to 5.5 Volts, the gate oxide thickness of isolation transistor is increased to 150 Angstroms. In this manner, the maximum junction voltage of isolation transistor 410 is increased to 3.6 Volts, well above the actual, maximum junction voltage of 3.25 Volts experienced by isolation transistor 410.

Note that if isolation transistor 410 has a gate oxide thickness of 50 Angstroms, then the width of this transistor can be approximately 120 microns +/−10% (see Table 1). However, if isolation transistor 410 has a gate oxide thickness of 150 Angstroms, then the width and length of this transistor are increased to be approximately 240 microns and approximately 0.54 microns, respectively (both +/−10%).

In the tristate mode, pull-up transistor 405A must be prevented from conducting current to Vddio (3.3 Volts, 2.5 Volts, or 1.8 Volts) when pad 411 is used as an input pin and carries a voltage up to 5.5 Volts. Thus, output driver 400 retains a well driver 406 to maintain a sufficiently high voltage on the well and the gate of pull-up transistor 405A to prevent leakage current through this transistor during this mode. One embodiment of well driver 406 is described in detail in U.S. patent application Ser. No. 09/595,780, entitled, "A Simplified 5V Tolerant Circuit for 3.3V I/O Design", filed by Xilinx, Inc. on the same date as the present application, which is incorporated by reference herein Pull-up transistor 405B must also be prevented from conducting current to Vddint (2.5 Volts) when pad 411 is used as an input pin and carries a voltage up to 5.5 Volts. However, as described previously, isolation transistor 410 has its gate connected to Vddint (2.5 Volts) and thus the voltage at the drain of pull-up transistor 405B is no more than Vddint minus an NMOS threshold drop (i.e., 2.75−0.7= 2.05). Therefore, transistor 405B, which has its well and source connected to Vddint, will not conduct even when a voltage of 2.05 Volts is provided on its drain. Thus, pull-up transistor 405B will not experience damaging voltage levels when pad 411 is used as an input pin and carries a voltage up to 5.5 Volts.

The embodiments described above are illustrative only and not limiting. Other embodiments will be apparent to those skilled in the art in light of the detailed description and figures. For example, although the invention is described in reference to an output driver in a CPLD, the invention is equally applicable to output drivers in other programmable logic devices as well as to other integrated circuits. The present invention is set forth in the appended claims.

What is claimed is:

1. An output driver circuit comprising:
 a pad;
 a pull-up circuit for pulling up a voltage on the pad to a first predetermined voltage, the pull-up circuit including:
  a first pull-up transistor coupled to the pad, the first pull-up transistor having a thick gate oxide; and
  a second pull-up transistor having a thin gate oxide and coupled to an internal voltage;
 a pull-down circuit for pulling down a voltage on the pad to a second predetermined voltage; and
 a logic circuit for disabling the pull-up circuit and the pull-down circuit.

2. The output driver circuit of claim 1, wherein the first pull-up transistor includes a PMOS transistor and the second pull-up transistor includes a PMOS transistor.

3. The output driver circuit of claim 1, wherein the first pull-up transistor has a thicker gate oxide than the second pull-up transistor.

4. The output driver circuit of claim 3, wherein the gate oxide thickness of the first pull-up transistor is 150 Angstroms.

5. The output driver circuit of claim 4, wherein the gate oxide thickness of the second pull-up transistor is 50 Angstroms.

6. The output driver circuit of claim 3, wherein the gate oxide thickness of the second pull-up transistor is the gate oxide thickness of standard transistors in the output driver.

7. The output driver circuit of claim 1, wherein the pull-up circuit includes a protection transistor having a gate coupled to the first predetermined voltage, a drain coupled to a gate of the first pull-up transistor, and a source coupled to receive an output signal of the logic circuit.

8. The output driver circuit of claim 7, wherein the pull-down circuit includes a pull-down transistor having a gate coupled to receive the output signal of the logic circuit, a source coupled to the second predetermined voltage, and a drain coupled to the pad.

9. The output driver circuit of claim 8, wherein the pull-down circuit includes an isolation circuit having a gate coupled to an internal voltage, a drain coupled to the pad, and a source coupled to the pull-down transistor.

10. The output driver circuit of claim 9, wherein the second pull-up transistor has a gate coupled to receive the output signal of the logic circuit, and a drain coupled between the pull-down transistor and the isolation transistor.

11. The output driver circuit of claim 10, wherein the pull-up circuit includes a logic shifter inverter for receiving the output signal of the logic circuit.

12. The output driver circuit of claim 1, wherein the first predetermined voltage is one of 3.3 Volts, 2.5 Volts, and 1.8 Volts.

13. An input/output (I/O) structure on an integrated circuit (IC), the I/O structure comprising:
 an I/O pad;
 an input driver for providing an input signal on the I/O pad to internal circuitry of the IC; and
 an output driver for providing an output signal from the internal circuitry of the IC to the I/O pad, wherein the output driver includes a first pull-up transistor that contributes to a first portion of the output signal, a second pull-up transistor having a gate and coupled to an internal supply voltage that contributes to a second portion of the output signal, and a pull-down transistor, wherein the first pull-up transistor has a thicker gate oxide than the second pull-up transistor to allow transfer of a higher voltage to the I/O pad than a voltage provided by the second pull-up transistor.

14. The I/O structure of claim 13, wherein each of the first pull-up transistor and the second pull-up transistor includes a gate coupled to receive the output signal from the internal circuitry.

15. The I/O structure of claim 14, wherein the second pull-up transistor includes a well coupled to the internal supply voltage.

16. An output driver for providing an output signal from internal circuitry of an IC to a pad, the output driver comprising:
 first means for contributing to a first portion of a pull-up signal, the first means including a first transistor having a first gate oxide thickness;
 second means for contributing to a second portion of the pull-up signal, the second means including a second transistor having a second gate oxide thickness different than the first gate oxide thickness and coupled to an internal supply voltage; and means for providing a pull-down signal.

17. The output driver of claim 16, wherein each of the first pull-up transistor and the second pull-up transistor has a gate for receiving the output signal from the internal circuitry.

18. The output driver of claim 17, wherein the second pull-up transistor includes a well coupled to the internal supply voltage.

19. A method of providing an output signal to a pad of an integrated circuit, the method comprising:

provide a first pull-up circuit to generate a first portion of a pull-up signal, wherein the first pull-up circuit includes a first transistor having a first gate oxide thickness;

providing a second pull-up circuit to generate a second portion of the pull-up signal, the second pull-up circuit including a second transistor having a second gate oxide thickness different than the first gate oxide thickness and coupled to an internal supply voltage;

providing a pull-down circuit to generate a pull-down signal; and providing a tristate circuit to selectively disable the first pull-up circuit, the second pull circuit, and the pull-down circuit.

* * * * *